United States Patent
Miller, Jr. et al.

(10) Patent No.: US 6,316,976 B1
(45) Date of Patent: *Nov. 13, 2001

(54) METHOD AND APPARATUS FOR IMPROVING THE PERFORMANCE OF DIGITAL DELAY LOCKED LOOP CIRCUITS

(75) Inventors: James E. Miller, Jr.; Aaron Schoenfeld; Manny Ma, all of Boise; R. Jacob Baker, Meridian, all of ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/560,848

(22) Filed: Apr. 28, 2000

Related U.S. Application Data

(63) Continuation of application No. 09/081,774, filed on May 20, 1998, now Pat. No. 6,069,506.

(51) Int. Cl.[7] .................................................. H03L 7/06
(52) U.S. Cl. .................. 327/156; 327/158; 327/276; 327/284; 377/54
(58) Field of Search ........................ 327/263, 269, 327/270, 272, 276, 277, 278, 284, 147, 149, 150, 156, 158, 159; 377/54, 56, 76

(56) References Cited

U.S. PATENT DOCUMENTS

| | | | |
|---|---|---|---|
| 4,789,996 | * 12/1988 | Butcher | 375/120 |
| 4,847,870 | 7/1989 | Butcher | 375/87 |
| 4,868,514 | 9/1989 | Azevedo et al. | 328/155 |
| 5,103,192 | 4/1992 | Sekine et al. | 331/14 |
| 5,179,303 | 1/1993 | Searles et al. | 327/157 |
| 5,223,755 | 6/1993 | Richley | 331/14 |
| 5,287,025 | 2/1994 | Nishimichi | 327/156 |
| 5,610,543 | 3/1997 | Chang et al. | 327/158 |
| 5,614,855 | 3/1997 | Lee et al. | 327/158 |
| 5,663,665 | 9/1997 | Wang et al. | 327/3 |
| 5,910,740 | 6/1999 | Underwood | 327/149 |
| 6,069,506 | * 5/2000 | Miller, Jr. et al. | 327/156 |

OTHER PUBLICATIONS

Anderson et al, "The 68040 32–b Monolithic Processor," IEEE Journal of Solid–State Circuits, vol. 25, No. 5, Oct. 1990.

Efendovich et al, "Multifrequency Zero–Jitter Delay–Locked Loop", IEEE Journal of Solid–State Circuits, vol. 29, No. 1, Jan. 1994.

Hatakeyama et al., "A 256–Mb SDRAM Using a Register–Controlled Digital DLL," IEEE Journal of Solid–State Circuits, vol. 32, No. 11, Nov. 1997.

* cited by examiner

Primary Examiner—Timothy P. Callahan
Assistant Examiner—An T. Luu
(74) Attorney, Agent, or Firm—Dickstein Shapiro Morin & Oshinsky LLP

(57) ABSTRACT

A method and apparatus for improving the performance and accuracy of a digital delay locked loop (DDLL) by using a unique correction latch and novel reset mechanism circuit for eliminating DDLL minimum and maximum delay states of inoperability. The accuracy of a DDLL is further improved by the use of a three-NAND gate logic delay element design. A DDLL according to the present invention provides symmetrical rising and falling edges of the signal at the output of each delay line element. A DDLL according to the present invention further ensures insensitivity to random values upon initialization. In addition, a DDLL according to the present invention has increased accuracy due to ensuring a comparison between the actual, not divided-down, input signal and an output signal during a phase detect operation.

14 Claims, 7 Drawing Sheets

(a)

| DDLL STATE / LATCH | SR | SL |
|---|---|---|
| NOT MIN DELAY NOT LATCHED | SR = SR | SL = SL |
| NOT MIN DELAY LATCHED | SR = 0 | SL = SR |
| MIN DELAY SET LATCH | SR = 0 | SL = SR |
| NOT MIN DELAY LATCHED SL' HAPPENS (RESET LATCH) | SR = SR | SL = SL |

$\Delta t_1 \neq \Delta t_2$ $\Delta t_1' \approx \Delta t_2'$

METHOD AND APPARATUS FOR IMPROVING THE PERFORMANCE OF DIGITAL DELAY LOCKED LOOP CIRCUITS

This application is a continuation of application Ser. No. 09/081,774 filed on May 20, 1998, now U.S. Pat. No. 6,069,506, which is hereby incorporated by reference.

BACKGROUND OF THE INVENTION

1. Field of the Invention

The present invention relates to circuitry for generation of periodic signals such as clock signals. More specifically, the present invention relates to digital delay locked loop circuits (DDLLs) having improved stability and performance.

2. Discussion of Related Art

Many high speed electronic systems possess critical timing requirements which dictate the need to generate a periodic clock wave form that possesses a precise time relationship with respect to some reference signal. The improved performance of computing integrated circuits (ICs) and the growing trend to include several computing devices on the same board present a challenge with respect to synchronizing the time frames of all the components.

While the operation of all components in the system should be highly synchronized, i.e., the maximum skew or difference in time between the significant edges of the internally generated clocks of all the components should be minute, it is not enough to feed the reference clock of the system to all the components. This is because different chips may have different manufacturing parameter which, when taken together with additional factors such as ambient temperature, voltage, and processing variations, may lead to large differences in the phases of the respective chip generated clocks.

Conventionally, synchronization is achieved by using DDLL circuits to detect the phase difference between clock signals of the same frequency and produce a digital signal related to the phase difference. By feeding back the phase difference-related signal to control a delay line, the timing of one clock signal is advanced or delayed until its rising edge is coincident with the rising edge of a second clock signal.

The operation of conventional DDLLs is shown in FIGS. 1 and 2. In FIG. 1, clock input buffer 104, delay lines 101, 102, and data output buffer 109 constitute an internal clock path. Delay line 101 is a variable delay generator with a logic-gate chain. A second delay line 102 is connected to replica circuits 108, which emulate the internal clock path components. Replica circuits 108 include dummy output buffer 110, with dummy load capacitance 111 and dummy clock buffer 107. The dummy components and second delay line 102 constitute a dummy clock path having exactly the same delay time as the internal clock path. Shift register 103 is used for activating a number of delay elements in both delay lines based on a command generated by phase comparator 106.

Phase comparator 106 compares the dummy clock and the external clock phases which differ by one cycle. This comparison is illustrated in FIGS. 2A, 2B, 2C, and 2D. External clock signal 200 is divided down in divider 105 to produce divided-down external signal 201. Signal 202 is the signal at the output of dummy delay line 102. Signal 203, which is generated inside phase comparator 106, is a one delay unit delayed output dummy line signal 202. If both signals 202 and 203 go high before 201 goes low, this means that the output clock is too fast and phase comparator 106 outputs a shift left (SL) command to shift register 103, as illustrated in FIG. 2B. Shift register 103 shifts the tap point of delay lines 102 and 101 by one step to the left, increasing the delay. Conversely, if both signals 202 and 203 go high after 201 goes low, this means that the output clock is too slow and phase comparator 106 outputs a shift right (SR) command to shift register 103, as illustrated in FIG. 2D. Shift register 103 shifts the tap point of delay lines 102 and 101 by one step to the right, decreasing the delay. If 201 goes low between the time 202 and 203 go high, the internal cycle time is properly adjusted and no shift command is generated, as illustrated in FIG. 2C. The output of the internal clock path in this case coincides with the rising edge of the external clock and is independent of external factors such as ambient temperature and processing parameters.

Conventional DDLLs, however, suffer from numerous drawbacks. One such drawback occurs in the event the DDLL is placed in a state of minimum or maximum delay. A state of minimum delay occurs when the delay between the input and output clock signals is as close to zero as allowed by the parameters of the delay line (i.e. when the tap point is at the very end of the delay line). In this case, if the DDLL attempts to decrease the delay, such decrease would be impossible because the delay line is already at minimum delay. Conversely, maximum delay occurs when the DDLL is as close to maximum delay as allowed by the parameters of the delay line (i.e. when the tap point is at the opposite end of the delay line). In the latter case, if the DDLL attempts to increase the delay, such increase would be impossible because the delay line is already at maximum delay. In these minimum and maximum delay states, the DDLL would be inoperable. A solution to this problem may be achieved by constructing a wrap-around loop, so that when the DDLL is at minimum delay, the delay line would shift around to maximum delay. This is not an optimal solution, however, because delay lines are typically of significant length and a lock could be achieved with a harmonic of the signal, which is undesirable.

Another drawback of conventional DDLLs is that they are inherently inaccurate. This inaccuracy is due to the fact that they compare a divided down version of the input clock signal, rather than the actual input clock signal, with the output clock signal, as shown in FIG. 2.

A further drawback of conventional DDLLs is that they are inherently inaccurate due to asymmetries in the delay line design. Typical logic-gate delay elements in conventional DDLLs are shown in FIG. 8 and operate as follows. Delay line 52 includes series connected delay elements, each delay element 51 consisting of two NAND gates and an inverter. The external clock is input into delay line 52 through a selected tap point, indicated by a high logic state in shift register 50. Depending on the command generated by the phase comparator (SL, SR, or no change), shift register 50 moves the tap point one delay element to the left or right, or does not shift the tap point. Unless the pull-up and pull-down times of the transistors forming the inverters and NANDs in each delay element are identical, however, the output of delay line 52 will consist of pulses with asymmetrical rising and falling edges. This asymmetry leads to differing time periods between any two rising and falling edges, as shown in FIG. 9(a). The output signal, therefore, will differ in shape from the input signal, which may lead to inaccuracies.

Yet another drawback of conventional DDLLs is that they operate under the constraint of random-initialized logic starting up at unknown values. This problem is typically resolved in conventional DDLLs by using initialization circuitry to power up the DDLL at some predetermined value. A drawback of this method of resolving the random-initialized logic problem is that if the initialization circuitry fails, it will be impossible for the DDLL to operate.

There is a need, therefore, to improve the performance of DDLLs by resolving the inoperability of the DDLL in states of minimum and maximum delay without losing accuracy due to the possibility of locking on to a harmonic of the signal, rather than the actual signal. Further, there is a need for increasing the accuracy of DDLLs by achieving a lock with the actual input signal, rather than a divided-down version of the input signal. Additionally, there is a need for improving the performance of DDLLs by providing a symmetrical delay line output signal. Finally, there is a need for improving the accuracy and performance of DDLLs by ensuring insensitivity to random-initialized logic at power up.

SUMMARY OF THE INVENTION

The present invention alleviates to a great extent the above shortcomings of conventional DDLLs. The invention provides a unique method of and apparatus for improving the performance of DDLLs by resetting the DDLL in the event it enters a state of maximum delay. Further, the invention provides a unique method of and apparatus for improving the performance and accuracy of DDLLs by providing a symmetrical delay line design, power up insensitivity of the DDLL, and lock-on to the actual, not divided down, version of the input clock.

An apparatus for improving the performance of DDLLs in accordance with the present invention comprises the addition of a correction latch to a conventional DDLL, which latches an activation signal upon detection of a state of minimum delay and generates an override shift left (or disabled shift right) signal, causing the delay line to shift left towards more delay. The correction latch is reset once the system itself generates a shift left signal towards more delay, at which point the system resumes normal operation. An apparatus for improving the performance of DDLLs in accordance with the present invention further comprises a reset mechanism which resets the shift register to a state of minimum delay, upon detection of a state of maximum delay. The DDLL then continues operation as in a state of minimum delay. The clock insertion point of the DDLL is the first zero-to-one transition. Using the first zero-to-one transition as the clock insertion point ensures insensitivity of the present invention to random-initialized logic at power up.

Further, an apparatus for improving the performance of DDLLs in accordance with the present invention comprises a three-NAND logic circuit delay element design which results in substantially symmetrical rising and falling edges of the output signal.

Finally, the apparatus for improving the performance of DDLLs in accordance with the present invention comprises a phase detect circuit comparing the actual, not a divided-down, input signal with the output signal, thereby increasing the accuracy of the present invention over conventional DDLLs.

The present invention thus provides a DDLL with improved performance and accuracy due to its novel correction latch and reset mechanism circuitry for eliminating minimum and maximum DDLL delay state inoperability without the risk of locking on to a harmonic of the signal passing through the delay line, while at the same time ensuring power up insensitivity. Additionally, the present invention provides a DDLL with improved performance and accuracy due to its symmetrical delay line design ensuring substantially symmetrical rising and falling edges of the signal at the output of each delay line logic circuit element. Finally, the present invention provides a DDLL with improved performance and accuracy due to ensuring a comparison between the actual, not divided-down, input signal and an output signal during a phase detect operation.

These and other advantages and features of the invention will become more clearly apparent from the following detailed description of the invention which is provided in connection with the accompanying drawings.

DETAILED DESCRIPTION OF THE PREFERRED EMBODIMENTS

Figure 1:
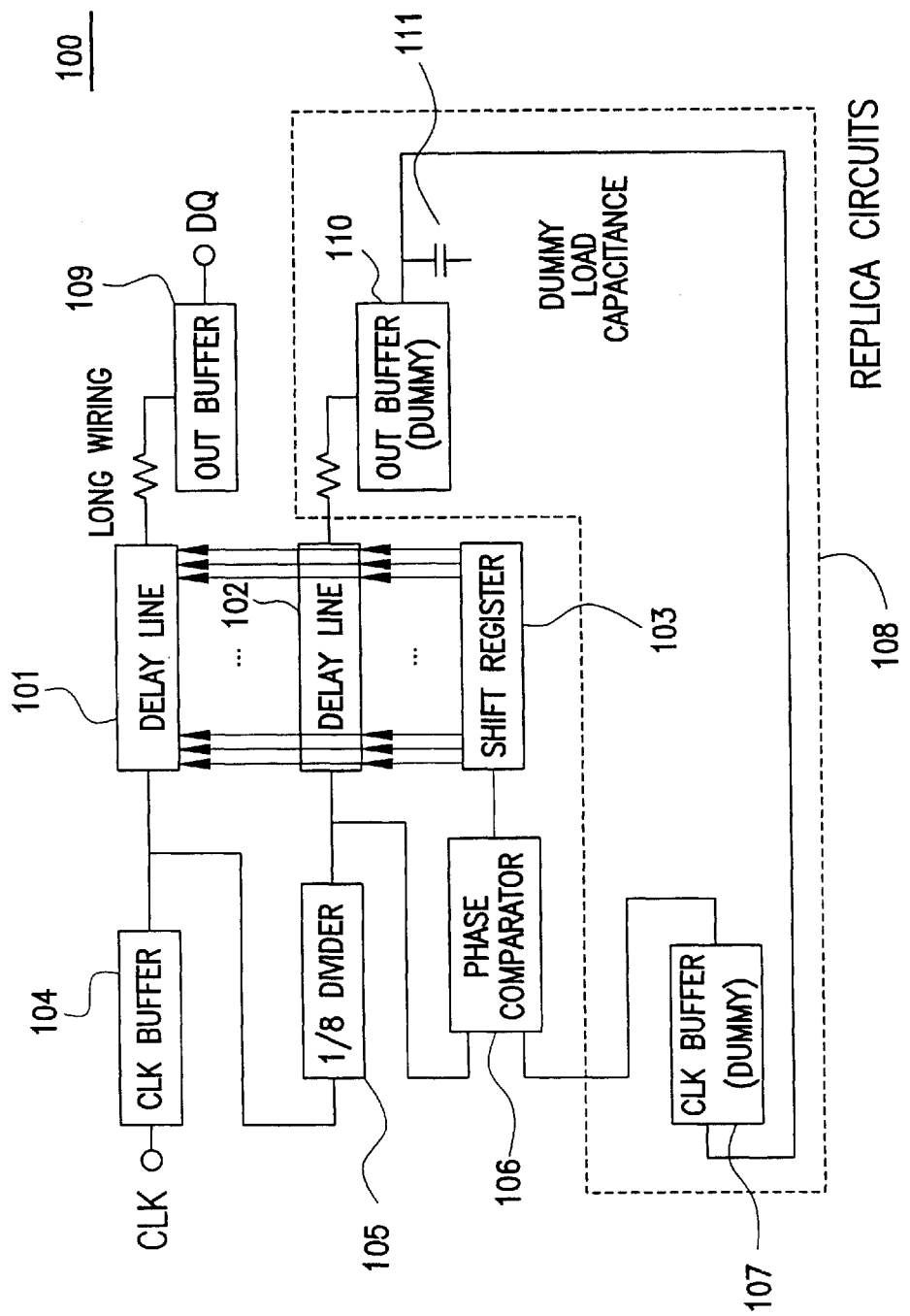
FIG. 1 is a block diagram showing the operation of a known digital delayed lock loop circuit (DDLL)
Figure 2:
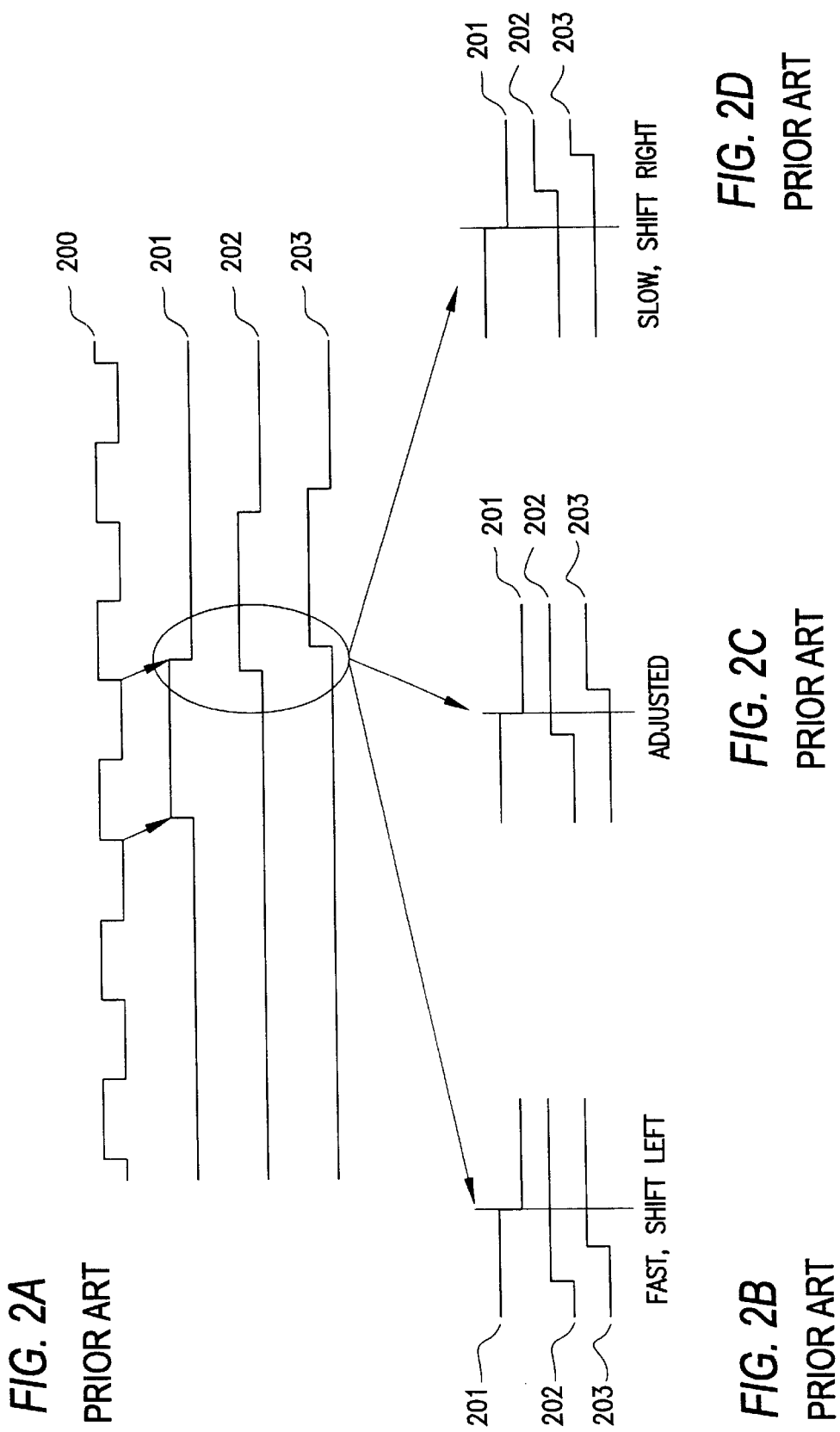
FIG. 2A is a timing diagram showing the operation of the DDLL of FIG. 1.
FIG. 2B is a timing diagram showing a faster internal signal than the external signal.
FIG. 2C is a timing diagram showing adjusted internal and external signals.
FIG. 2D is a timing diagram showing a slower internal signal than the external signal.
Figure 3:
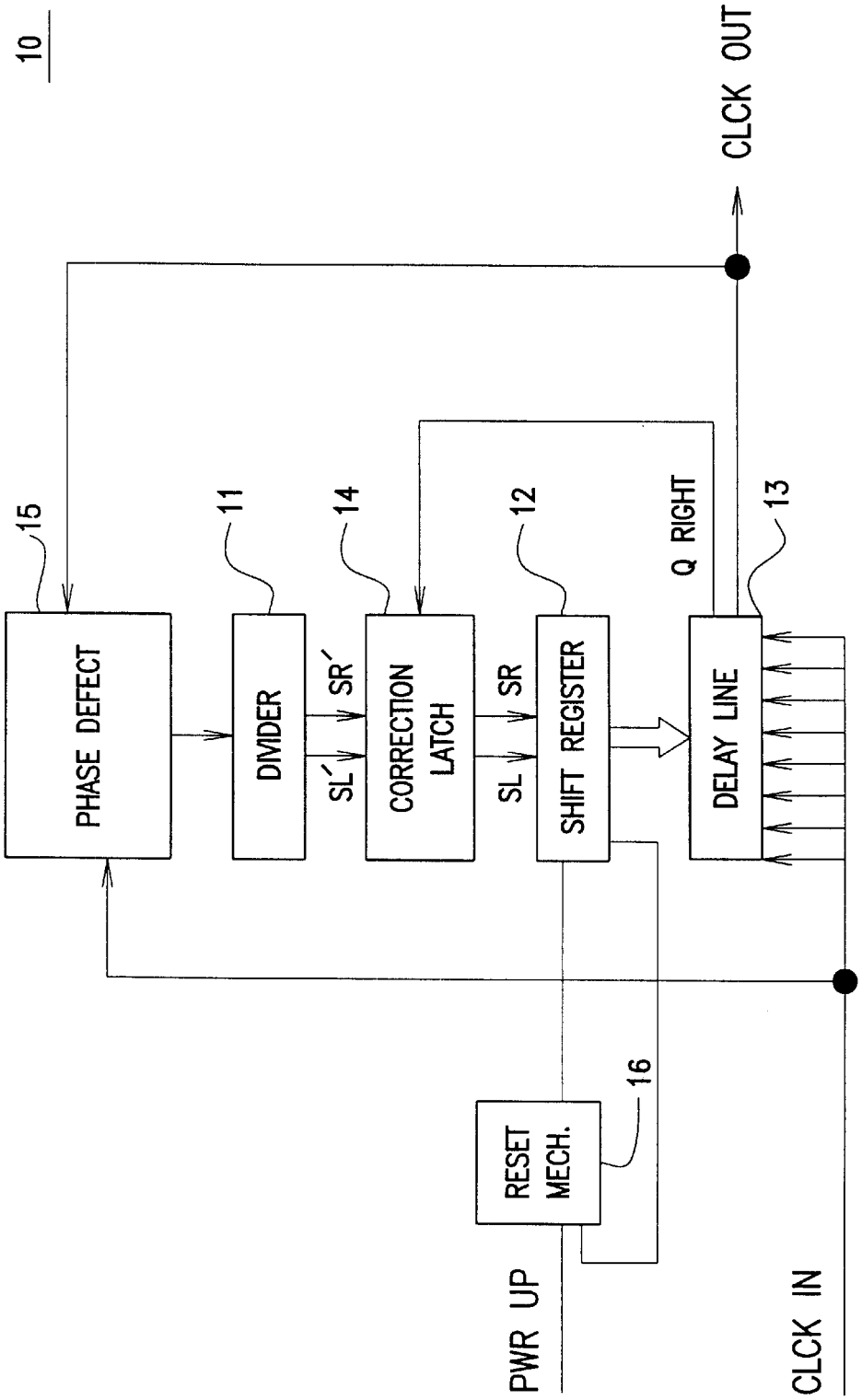
FIG. 3 is a block diagram showing the operation of an improved DDLL in accordance with a preferred embodiment of the present invention.

Preferred embodiments of the present invention are now described in detail in connection with the accompanying drawings. FIG. 3 illustrates a block diagram of DDLL 10, which differs from a conventional DDLL in that there is a newly provided correction latch 14 which is connected to receive the shift left (SL) or shift right (SR) correction signal from phase detect circuit 15 via divide by two circuit 11. DDLL 10 further differs from a conventional DDLL in that there is newly provided a reset mechanism 16, designed to reset shift register 12 upon detection of a state of maximum delay.

DDLL 10 has an input clock signal CLCK IN (reference signal) which is fed into delay line 13 and an output clock signal CLCK OUT, which differs in phase with respect to CLCK IN by a quantum of time, but which ideally should be in phase with CLCK IN. Phase detector 15 compares the phases of the CLCK IN and CLCK OUT signals (preferably, phase detect 15 operates to match the rising edge of signal CLCK OUT to a rising edge of signal CLCK IN) and generates a digital signal related to the difference in phase between the two signals. Preferably, phase detector 15 is a phase comparator wherein the output of the phase detector is a binary signal that is high if CLCK OUT is ahead in phase of CLCK IN and low if CLCK OUT is behind CLCK IN in phase. Alternatively, phase detector 15 may be configured to generate a low output if CLCK OUT is ahead in phase of CLCK IN and a high output if CLCK OUT is behind CLCK IN.

The binary signal is representative of whether CLCK OUT is delayed with respect to CLCK IN, fast with respect to CLCK IN, or in phase with respect to CLCK IN. Thus, this binary signal represents a shift left, shift right, or no signal, respectively, to be applied to shift register 12 for aligning the phases of CLCK IN and CLCK OUT.

The output of phase detector 15 is applied, after passing through divide by two circuit 11, to shift register 12, causing a change in the bit value of shift register 12 if CLCK IN and CLCK OUT are out of phase. Shift register 12 contains a plurality of stages storing a bit pattern which consists of all "0"s followed by all "1"s (or vice versa). The point of transition is where shift register 12 sets the delay of delay line 13. Consequently, the shift left and shift right signals cause this transition point to move one register stage to the left or right depending on the incoming command from divider 11.

Divider circuit 11 produces at its output two signals, SL' and SR', divided down from the output of phase detect 15. In this embodiment, divider circuit 11 is a divide by two circuit. The bit value change is one bit to the right if CLCK OUT is delayed with respect to CLCK IN or one bit to the left if CLCK OUT is ahead of CLCK IN. If CLCK IN and CLCK OUT are in phase, there is no change in the bit value of shift register 12.

A change in the bit value of shift register 12 to the left or to the right, operates to regulate the delay of delay line 13 by shifting the tap point (delay element) which controls the amount delay by one delay element to the left or the right respectively. Thus, in an 8-bit shift register, the first zero to one transition, is indicative of the location of the tap point. The tap point in FIG. 5, for example, is delay element n, indicating the first zero to one transition in shift register 12 (looking from left).

The problem arises when DDLL 10 in FIG. 3 enters a state of minimum or maximum delay. Minimum delay is the state when the tap point is the rightmost delay element of delay line 13 (i.e., delay element n+4 in FIG. 5). In this case, if CLCK IN and CLCK OUT are very close together, yet not completely in phase, DDLL 10 will operate to minimize the delay by generating an SR signal. However, delay line 13 cannot shift any further to the right because it is already at the last delay element (i.e., a high value in the last delay element would be indicative of minimum delay state and of the existence of a tap in the last delay element).

Thus, when the last delay element (n+4 in FIG. 5) goes high, delay line 13 generates a Qright signal to correction latch 14, which latches to override the SR' signal at the output of phase detect 15 and divider 11 and to instead generate a SL signal at its output. In this case, shift register 12 begins to shift left for each correction signal, beginning to fill shift register 12 with zeros from bit n+4 towards bit n−3.

Figure 4:
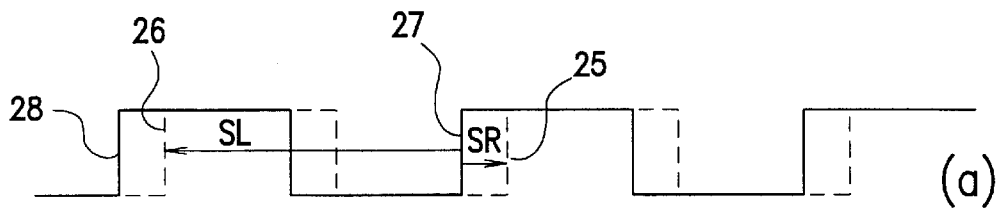
FIG. 4 is a timing diagram showing the DDLL in a state of minimum delay.

The operation of DDLL 10 in a state of minimum delay is shown in FIG. 4. If DDLL 10 is in a state of minimum delay, but CLCK IN and CLCK OUT are not completely in phase as indicated by rising edges 25 (CLCK IN) and 27 (CLCK OUT), DDLL 10 will attempt to minimize the delay by shifting right to align rising edge 27 of CLCK OUT with rising edge 25 of CLCK IN. The delay line, however, cannot decrease the delay any more and the DDLL will begin generating a continuous SR command, without the delay line having the ability to implement it. Correction latch 14 registers this state based on the high Qright signal and overrides the shift right command, causing shift register 12 to begin shifting to the left, going more and more into delay, until it locks rising edges 26 and 28. Correction latch 14 is reset upon receipt of a SL' command from phase detect circuit 15, indicating that rising edge 26 is ahead of rising edge 28, and the system resumes normal operation. The Qright signal is generated whenever the rightmost bit position of shift register 12 (i.e., bit position n+4 in FIG. 5) contains a "1."

The function of divider circuit 11 in FIG. 3 is to reduce the instability that would otherwise be caused as a result of DDLL 10 attempting to make phase corrections in mid-cycle. This means that delay line 13 must be provided with at least one clock cycle to implement the previous phase detect SR or SL command, before being issued a new one. Divide by two circuit 11 enables corrections via correction latch 14 to occur on every other clock cycle, rather than on every cycle. This helps eliminate mid-cycle correction oscillation or jitter because it enables the current delay to propagate through delay line 13 before changing the value of delay line 13. Mid-cycle delay adjustments cause jitter because the delay line is adjusting itself on the fly, while at the same time feeding the output signal into phase detect circuit 15.

Reset mechanism 16 resets the DDLL to a state of minimum delay, if a state of maximum delay is encountered. Reset mechanism 16 may comprise, for example, a NAND gate. Maximum delay is the state when delay line 13 is functioning at its maximum delay (i.e. the tap is the leftmost element n−3 in delay line 13) and shift phase detect 15 issues a SL command. In this case, shift register 12 will be filled with low values (or zeros). Most importantly, the value of shift register bit n−3 will become zero, which will cause reset mechanism 16 to reset shift register 12 to a state of minimum delay. The DDLL then operates as described above with respect to a state of minimum delay (all "1"s).

The present invention is insensitive to random values upon initialization. The DDLL will operate regardless of the state it powers up to because the first zero to one transition in the shift register will cause the DDLL to operate normally. If the DDLL powers up to a state where there are no zero to one transitions (i.e. shift register 12 is filled with all ones or all zeros), the DDLL will operate as follows. If shift register 12 is filled with all ones, the DDLL is in a state of minimum delay and will operate as described above with respect to minimum delay. If shift register 12 is filled with all zeros, the DDLL is in a state of maximum delay and will be shifted to a state of minimum delay and operate as described above with respect to minimum delay.

Figures 6, 7:
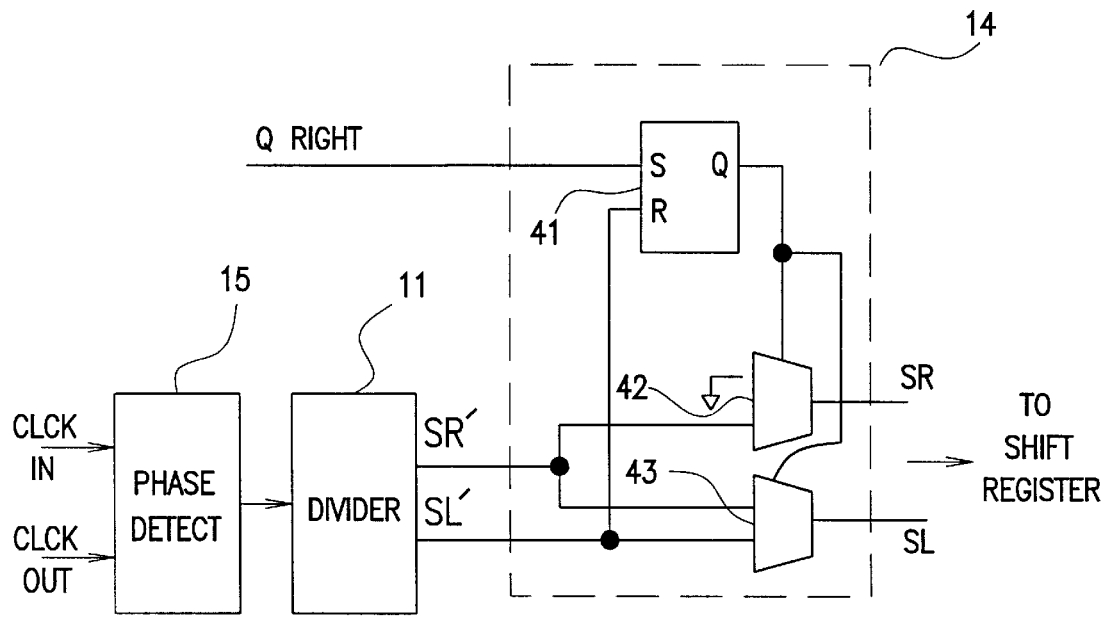
FIG. 6 is a circuit diagram of the correction latch ensuring override shift left signals upon detection of a state of minimum delay, according to a preferred embodiment of the present invention.
FIG. 7 is a table indicating the operation of the correction latch in FIG. 6 depending upon the state of the correction latch.

FIG. 6 depicts the circuitry of correction latch 14 in FIG. 3 in more detail, according to a preferred embodiment of the present invention. Correction latch 14 consists of set-reset latch 41 and two multiplexers 42 and 43 connected to the SL' and SR' outputs of divider 11. The operation of this circuit is explained in connection with the table in FIG. 7. Signal Qright is generated when the rightmost delay element n+4 in delay line 13 goes to a "1" state, i.e., when the DDLL is in minimum delay.

The table depicted in FIG. 7 indicates the status of the shift right (SR) and shift left (SL) signals at the output of correction latch 14 in FIG. 6, depending on the latched/unlatched state of set-reset latch 41. Thus, when set-reset latch 41 is not latched, SL'=SL and SR'=SR, until Qright goes high ("1") and latch 41 latches. That would be the case of minimum delay, and SR' is high, but correction latch 14 operates to override it and to provide SR=0 and SL=SR, that is, SL goes high instead of SR and the shift register begins to insert zeros in the delay line starting at the n+4 element. This continues until correction latch 14 is reset, i.e., even if the DDLL is not in minimum delay and Qright now goes to "0," SR=0 and SL=SR will continue as the output of latch 14 until latch 14 is reset. Latch 14 is reset upon SL' going high, which indicates that CLCK OUT is ahead of CLCK IN and phase detect circuit 15 is compensating for this. At this time, SR=SR and SL=SL and the DDLL resumes its normal operation.

Figure 5:
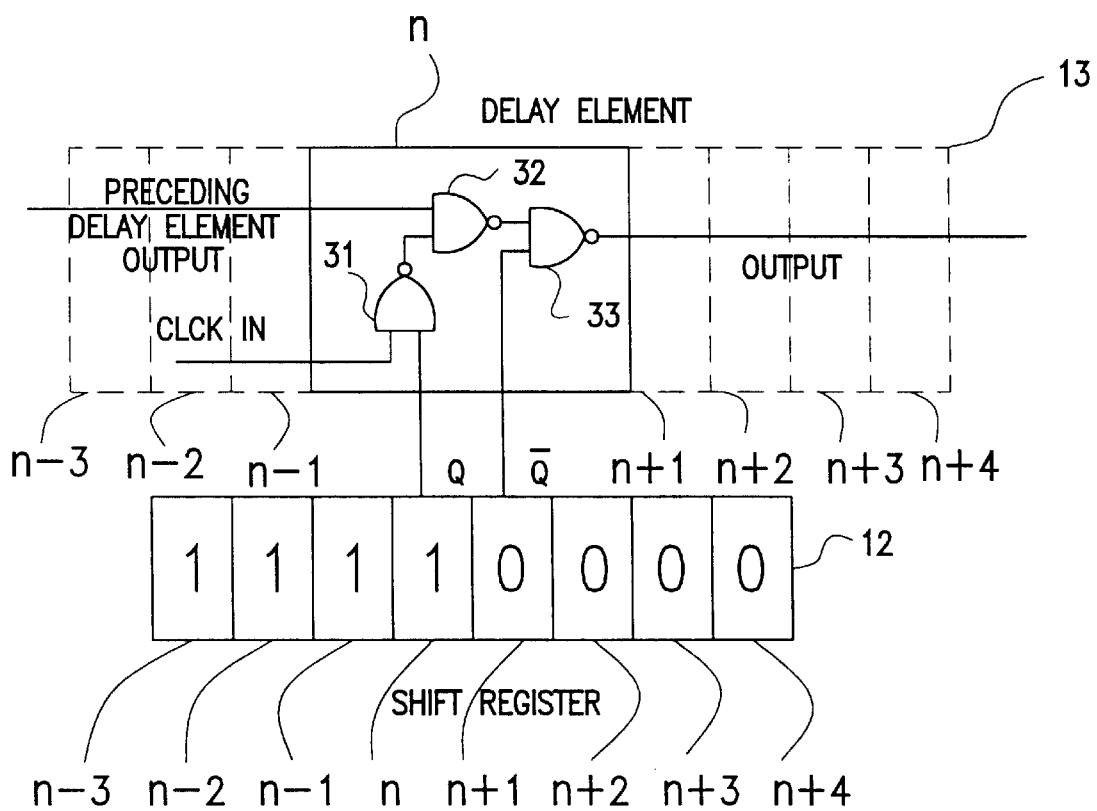
FIG. 5 is a circuit diagram showing the logic circuit design of each delay element in the symmetrical delay line according to a preferred embodiment of the present invention.

FIG. 5. illustrates another aspect of the present invention, the structure and operation of delay element n in delay line 13. FIG. 5 depicts an 8-bit shift register 12 connected to an 8-element delay line 13, each delay element n of which has a novel symmetrical 3-NAND gate design. Each delay element n consists of 3 NAND logic circuits 31, 32 and 33, where the inputs of NAND 31 are the CLCK IN signal and the corresponding shift register bit (n); the inputs of NAND 32 are the output of the preceding delay element (n−1) and the output of NAND 31; and the inputs of NAND 33 are the output of NAND 32 and the subsequent shift register bit (n+1). Thus, the clock insertion point (i.e., tap) in delay line 13 is at the first 0 to 1 transition (viewed from right to left in FIG. 5).

Figure 8:
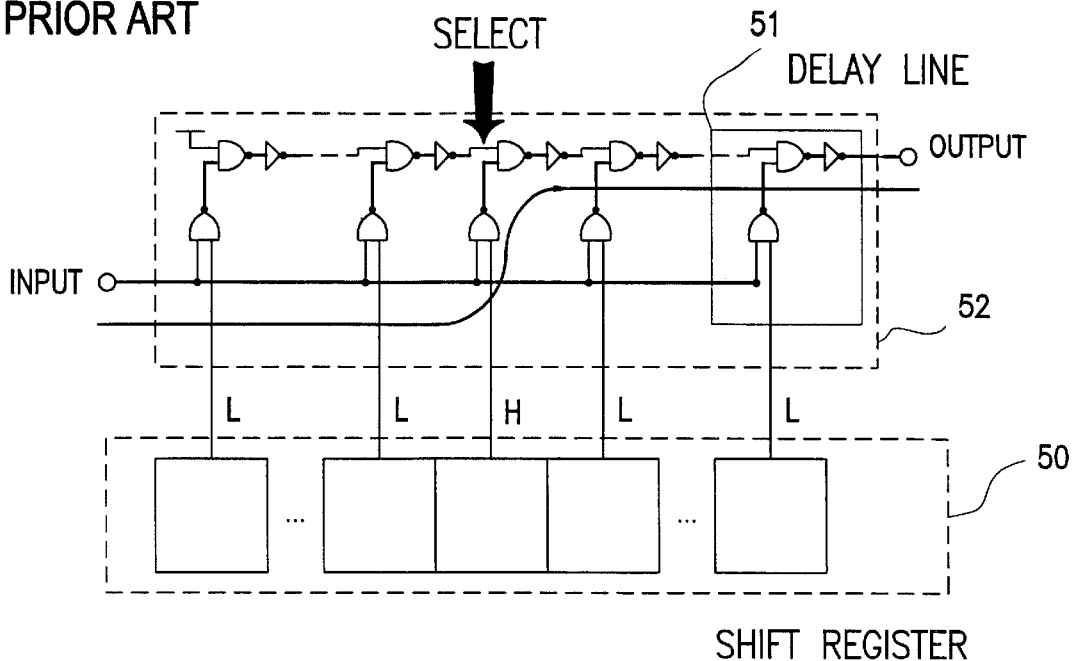
FIG. 8 is a circuit diagram showing the logic circuit design of each delay element in a known delay line.
Figure 9A:
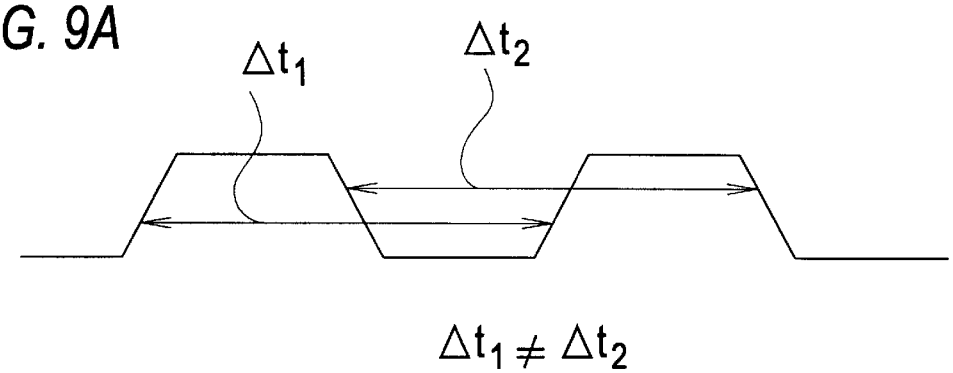
FIG. 9A is a timing chart showing the difference between the rising and falling edges of the signals at the outputs of the logic circuit delay elements shown in FIG. 8.
Figure 9B:
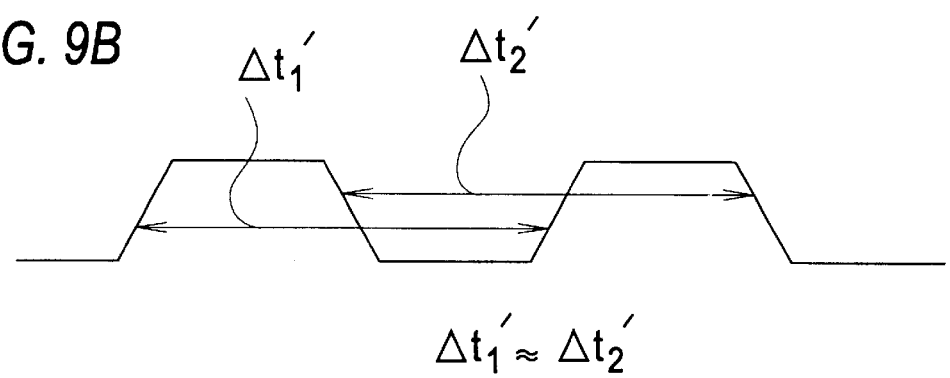
FIG. 9B is a timing chart showing the difference between the rising and falling edges of the signals at the outputs of the logic circuit delay elements shown in FIG. 5.

Another aspect of the structure of delay element n in delay line 13 (FIG. 5) is that because of its 3-NAND symmetrical design, it provides substantially symmetrical rising and falling edges of the CLCK OUT signal at its output. This is depicted in FIG. 9(b), where Δt1' is very close to Δt2'. This is a significant advantage over the prior art shown in FIG. 8, where delay element 51 of delay fine 52 consists of two NAND elements and an inverter. Because the transistors forming the inverters and the NANDs in each delay element do not have identical rise and decay times, the signal at the output of prior art delay element 51 has asymmetrical rising and falling edges. The CLCK OUT signal will therefore differ in shape from the CLCK IN signal, leading to inaccuracies.

Figure 10:
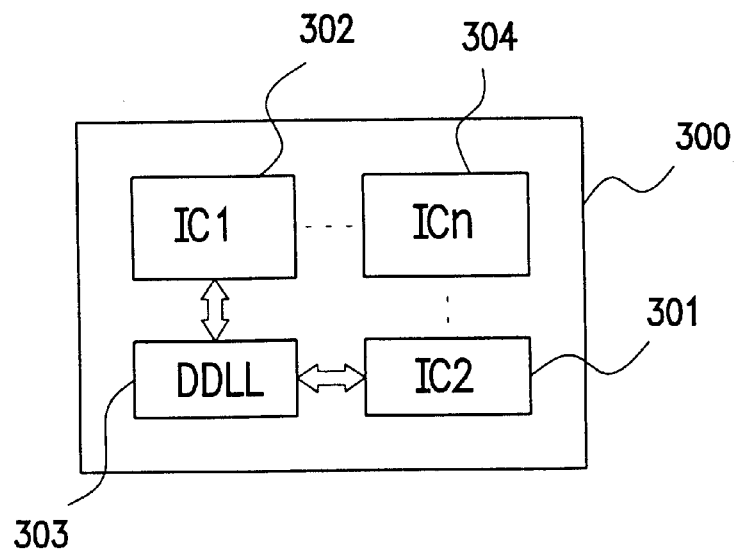
FIG. 10 is a block diagram of a printed circuit board (PCB) implementing the DDLL of the present invention.

FIG. 10 shows printed circuit board (PCB) 300 with multiple ICs 301, 302, 304 having differences in the phases of the IC generated internal clocks. DDLL 303 operates to align the phases of the internally generated clock signals of ICs 301 and 302 according to the instant invention. PCB 300 could be used in a computer system where one of ICs 301 and 302 is a microprocessor and the other is a memory device, a storage device controller, or an input/output device controller.

Figure 11:
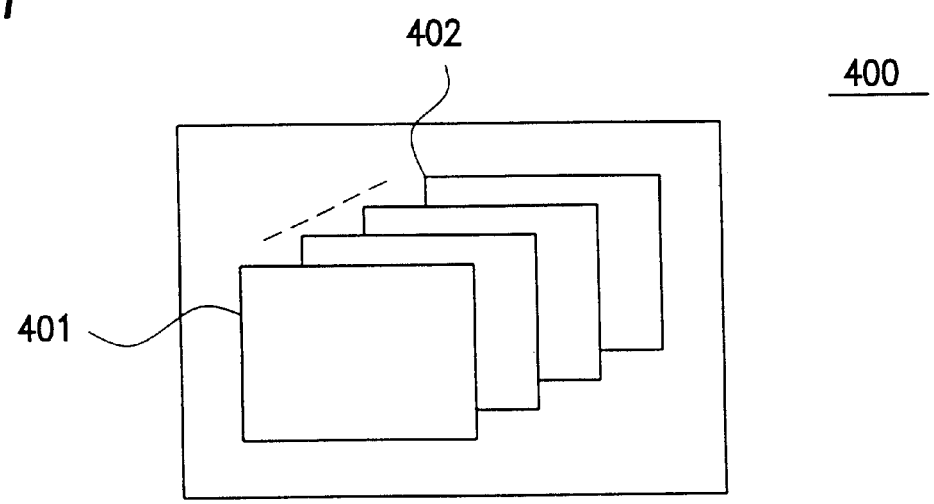
FIG. 11 is a block diagram of a computer system implementing the present invention.

FIG. 11 shows electronic system 400 having multiple PCBs 401, 402, operating as PCB 300 in FIG. 10.

The present invention has broad applicability in all electronic computer systems employing more than one IC with an internal clock. The above description is intended to be illustrative, not restrictive. Many modifications which do not depart from the spirit or scope of the invention will be apparent to those skilled in the art upon reviewing the above description. Accordingly, the invention is not limited by the foregoing description, but is only limited by the scope of the appended claims.

What is claimed is new and desired to be secured by Letters Patent of the United States is:

1. An apparatus for synchronizing clock signals of a plurality of integrated circuits, said apparatus for use with a phase detect circuit, shift register and a delay line having a delay state output, said apparatus comprising:
   a correction latch for receiving a control signal from the phase detect circuit and being coupled to the shift register and the delay state output, said correction latch generating an override shift command to the shift register when a state of minimum delay is provided by the delay state output.

2. The apparatus of claim 1, wherein said override shift command causes the shift register to output a command to increase a delay in the delay line until the phase detect circuit generates the control signal with a value to increase the delay.

3. The apparatus of claim 1 further comprising a reset mechanism coupled to a maximum delay stage of the shift register for resetting the shift register when contents of the maximum delay stage correspond to a state of maximum delay in the delay line.

4. The apparatus of claim 1 further comprising a divide by n frequency divider having an input for receiving the control signal and n outputs representing the control signal coupled to said correction latch, said n outputs controlling said correction latch to allow delay line correction on every nth input to said frequency divider.

5. The apparatus of claim 4, wherein n equals 2.

6. An apparatus for synchronizing clock signals of a plurality of integrated circuits, said apparatus for use with a shift register, delay line and a phase detect circuit generating a control signal, said apparatus comprising:
   a reset mechanism coupled to a maximum delay stage of the shift register for resetting the shift register to a predetermined state when contents of the maximum delay stage correspond to a state of maximum delay in the delay line;
   a latch circuit coupled to the shift register; and
   a divide by n frequency divider having an input for receiving the control signal and n outputs representing the control signal coupled to said latch circuit, said n outputs controlling said latch circuit to allow delay line correction on every nth input to said frequency divider.

7. The apparatus of claim 6, wherein n equals 2.

8. A computer system comprising:
   an apparatus for synchronizing clock signals of a plurality of integrated circuits, said apparatus for use with a phase detect circuit, shift register and a delay line having a delay state output, said apparatus comprising:
      a correction latch for receiving a control signal from the phase detect circuit and being coupled to the shift register and the delay state output, said correction latch generating an override shift command to the shift register when a state of minimum delay is provided by the delay state output.

9. The system of claim 8, wherein said override shift command causes the shift register to output a command to increase a delay in the delay line until the phase detect circuit generates the control signal with a value to increase the delay.

10. The system of claim 8, wherein said apparatus further comprises a reset mechanism coupled to a maximum delay stage of the shift register for resetting the shift register when contents of the maximum delay stage correspond to a state of maximum delay in the delay line.

11. The system of claim 8, wherein said apparatus further comprises a divide by n frequency divider having an input for receiving the control signal and n outputs representing the control signal coupled to said correction latch, said n outputs controlling said correction latch to allow delay line correction on every nth input to said frequency divider.

12. The system of claim 11, wherein n equals 2.

13. A computer system comprising:
   an apparatus for synchronizing clock signals of a plurality of integrated circuits, said apparatus for use with a shift register, delay line and a phase detect circuit generating a control signal, said apparatus comprising:
   a reset mechanism coupled to a maximum delay stage of the shift register for resetting the shift register to a predetermined state when contents of the maximum delay stage correspond to a state of maximum delay in the delay line;
   a latch circuit to be coupled to the shift register; and
   a divide by n frequency divider having an input for receiving the control signal and n outputs representing the control signal coupled to said latch circuit, said n outputs controlling said latch circuit to allow delay line correction on every nth input to said frequency divider.

14. The system of claim 13, wherein n equals 2.

* * * * *